United States Patent
DeLoraine et al.

(10) Patent No.: US 8,316,832 B2
(45) Date of Patent: Nov. 27, 2012

(54) DIAGNOSIS OF THE FOULING CONDITION OF SPARKPLUGS IN A RADIOFREQUENCY IGNITION SYSTEM

(75) Inventors: Franck DeLoraine, Fontenay Aux Roses (FR); Julien Couillaud, Athis Mons (FR); Xavier Jaffrezic, Velizy-Villacoublay (FR)

(73) Assignee: Renault S.A.S., Boulogne Billancourt (FR)

( * ) Notice: Subject to any disclaimer, the term of this patent is extended or adjusted under 35 U.S.C. 154(b) by 185 days.

(21) Appl. No.: 12/663,715

(22) PCT Filed: Jun. 4, 2008

(86) PCT No.: PCT/FR2008/050986
§ 371 (c)(1),
(2), (4) Date: Apr. 13, 2010

(87) PCT Pub. No.: WO2009/004204
PCT Pub. Date: Jan. 8, 2009

(65) Prior Publication Data
US 2010/0206276 A1    Aug. 19, 2010

(30) Foreign Application Priority Data
Jun. 12, 2007   (FR) .................................... 07 04190

(51) Int. Cl.
*F02P 1/00* (2006.01)

(52) U.S. Cl. ......................................... 123/594; 123/606
(58) Field of Classification Search .................. 123/594, 123/596, 597, 605, 606, 143 R
See application file for complete search history.

(56) References Cited

U.S. PATENT DOCUMENTS

| | | | |
|---|---|---|---|
| 4,446,826 A * | 5/1984 | Kimura et al. | 123/143 B |
| 4,846,129 A | 7/1989 | Noble | |
| 5,187,580 A | 2/1993 | Porter, Jr. et al. | |
| 6,357,426 B1 * | 3/2002 | Schleupen | 123/606 |
| 2009/0165764 A1 * | 7/2009 | Agneray et al. | 123/606 |
| 2010/0229639 A1 * | 9/2010 | Agneray et al. | 73/114.67 |

FOREIGN PATENT DOCUMENTS

FR     2 680 833      3/1993
FR     2 859 869      3/2005

* cited by examiner

*Primary Examiner* — John Kwon
(74) *Attorney, Agent, or Firm* — Oblon, Spivak, McClelland, Maier & Neustadt, L.L.P.

(57) ABSTRACT

A radiofrequency ignition device including: a control capable of generating an ignition control signal; a supply circuit controlled by the ignition control signal for applying a supply voltage on an output interface of the supply circuit at a frequency defined by the control signal; at least one plasma generation resonator connected on an output interface of the supply circuit and capable of generating a spark between two ignition electrodes of the resonator upon an ignition control; a mechanism measuring an electric parameter representative of a variation in a supply voltage of the resonator; and a module determining the fouling condition of the electrodes based on the measured electric parameter and on a predetermined reference value.

12 Claims, 2 Drawing Sheets

DIAGNOSIS OF THE FOULING CONDITION OF SPARKPLUGS IN A RADIOFREQUENCY IGNITION SYSTEM

The present invention relates, in general, to the systems for generating plasma between two electrodes of a sparkplug, used notably for controlled microwave ignition of a gas mixture in combustion chambers of an internal combustion engine.

The invention relates more particularly to a microwave ignition device comprising:
- a control means capable of generating an ignition command signal,
- a supply circuit, controlled by the ignition command signal, in order to apply a supply voltage to an output interface of the supply circuit at the frequency defined by the command signal,
- at least one plasma-generation resonator connected to the output interface of the supply circuit and capable of generating a spark between two electrodes of said resonator during an ignition command.

For an application to plasma-generation motor vehicle ignition, use is made of coils-on-plugs (described in detail in the following patent applications filed in the name of the applicant, FR 03-10766, FR 03-10767 and FR 03-10768), modeled by a resonator 1 (see FIG. 1), the resonance frequency $F_c$ of which is greater than 1 MHz, and typically around 5 MHz. The resonator comprises in series a resistor R, an inductor L and a capacitor C. Ignition electrodes 10 and 12 of the coil-on-plug are connected to the terminals of the capacitor C of the resonator, making it possible to generate multifilament discharges in order to initiate the combustion of the mixture in the combustion chambers of the engine, when the resonator is supplied.

Specifically, when the resonator is supplied by a high voltage at its resonance frequency $F_c$ ($1/(2\pi\sqrt{L*C})$), the amplitude at the terminals of the capacitor C is amplified so that multifilament discharges develop between the electrodes, over distances of the order of a centimeter, at high pressure and for peak voltages below 20 kV.

The term then used is "ramified sparks", because they imply the simultaneous generation of at least several ionization lines or paths in a given volume, their ramifications also being omnidirectional.

This application to microwave ignition requires the use of a supply, capable of generating voltage pulses typically of the order of 100 ns, that are capable of achieving amplitudes of the order of 1 kV, at a frequency very close to the resonance frequency of the plasma-generation resonator of the microwave coil-on-plug. The smaller the difference between the resonance frequency of the resonator and the operating frequency of the supply, the higher the overvoltage coefficient of the resonator (the ratio between the amplitude of its output voltage and its input voltage).

FIG. 2 illustrates schematically such a supply, given in detail moreover in patent application FR 03-10767. Conventionally, the supply uses an assembly called a "Class E power amplifier". This type of DC/AC converter makes it possible to create the voltage pulses with the aforementioned characteristics.

According to the embodiment of FIG. 2, such a supply circuit 2 has a power MOSFET transistor M and a parallel resonant circuit 4 comprising an inductor Lp in parallel with a capacitor Cp. The transistor M is used as a switch in order to control the switchings at the terminals of the parallel resonant circuit and of the plasma-generation resonator 1 designed to be connected to an output interface OUT of the supply circuit.

Means 5 for controlling the supply circuit are suitable for generating a logic command signal V1, designed to be applied to the grid of the transistor M, at a frequency that must be substantially fixed on the resonance frequency of the resonator 1.

The ignition device as has just been described is supplied by a voltage Vinter prevailing at the terminals of a capacitor Cb of the supply circuit. The voltage Vinter may advantageously be supplied by a high-voltage power supply connected to the capacitor Cb, typically a DC/DC converter.

Therefore, close to its resonance frequency, the parallel resonator 4 converts the direct current supply voltage Vinter into an amplified periodic voltage Va, corresponding to the supply voltage multiplied by the overvoltage coefficient of the parallel resonator and applied to the output interface of the supply circuit at the drain of the switch transistor M.

The switch M then applies the amplified supply voltage Va to the power supply output, at the frequency defined by the command signal V1, which the user is seeking to make as close as possible to the resonance frequency of the coil-on-plug. Specifically, when there is an ignition command, in order to be able to set the microwave ignition device resonating and maximize the voltage at the terminals of the electrodes of the coil-on-plug in order to obtain the expected spark, the coil-on-plug must be controlled substantially at its resonance frequency.

In the context of controlled ignition in a cylinder of a combustion engine, the coil-on-plug is screwed onto the engine and its central electrode is housed in the combustion chamber of the corresponding cylinder of the engine. As the plasma discharges generated by the coil-on-plug occur, a phenomenon of fouling of the sparkplug is capable of occurring, which is characterized by the deposit of combustion waste in the form of soot on the central electrode and on the ceramic around the latter. This phenomenon, beyond a certain level of fouling, degrades the operation of the coil-on-plug and causes misfires.

Hitherto, the most common manner of diagnosing the state of fouling of the electrodes of the coil-on-plug has consisted in removing the latter from its location in the combustion chamber and of checking, via a visual analysis, its state of fouling.

The object of the present invention is to improve the diagnosis of the state of fouling of the electrodes of the microwave coil-on-plug.

The device according to the invention, moreover according to the definition given thereto by the preamble above, is essentially characterized in that it comprises:
- means for measuring an electric parameter representative of a change in the supply voltage of the resonator, and
- a module for determining a state of fouling of the electrodes, as a function of the electric parameter measured and of a predetermined reference value.

Preferably, the electric parameter is the voltage at the terminals of a storage capacitor of the supply circuit, suitable for being charged to the supply voltage before an ignition command.

According to one embodiment, the supply circuit comprises a switch controlled by the ignition command signal in order to apply the supply voltage to the output interface at the frequency defined by the command signal.

Advantageously, the command frequency is substantially equal to the resonance frequency of the plasma-generation resonator.

The plasma-generation resonator used is suitable for carrying out an ignition in one of the following applications:

controlled ignition of a combustion engine, ignition in a particle filter, decontamination ignition in an air-conditioning system.

Advantageously, the device according to the invention comprises a means of supplying information on the state of fouling of the electrodes, said means being installed on a Man-Machine Interface of a motor vehicle.

The invention also relates to a method for diagnosing a state of fouling of the ignition electrodes of at least one microwave plasma-generation resonator connected to an output interface of a supply circuit configured to deliver to said output interface a supply voltage at a command frequency during an ignition command, said resonator being capable of generating a spark between the two electrodes during the ignition command, said method being characterized in that it comprises the steps of:
  measuring, during the ignition command, a change in an electric parameter representative of the change in the supply voltage,
  comparing the measured change with a predetermined reference value;
  determining the state of fouling of the electrodes as a function of the difference between the measured change and the reference value.

Preferably, the change in voltage at the terminals of a storage capacitor of the supply circuit is measured, said capacitor being charged to the supply voltage before the ignition command.

According to one embodiment, the measured change arises from the difference between the measurement of the voltage at the terminals of the storage capacitor at the beginning and at the end of the ignition command.

Advantageously, the reference value corresponds to said change before fouling.

Preferably, the method comprises a step consisting in informing a user of the state of fouling. Advantageously, such information supplied to the user makes it possible to notify him of a future ignition failure.

Other features and advantages of the present invention will appear more clearly on reading the following description given as an illustrative and nonlimiting example and made with reference to the appended figures in which.

Figure 1:
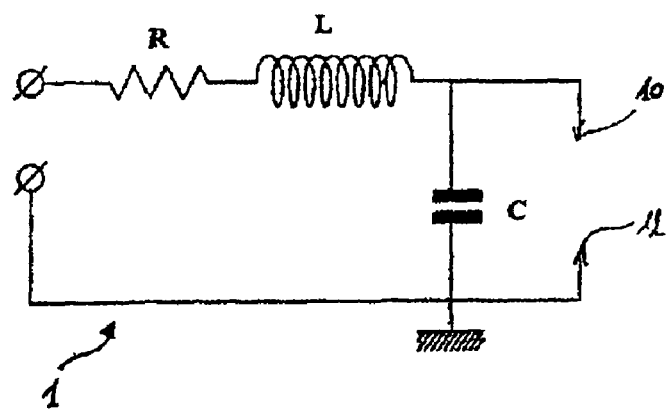
FIG. 1 is a diagram of a resonator modeling a plasma-generation microwave coil-on-plug.
Figure 2:
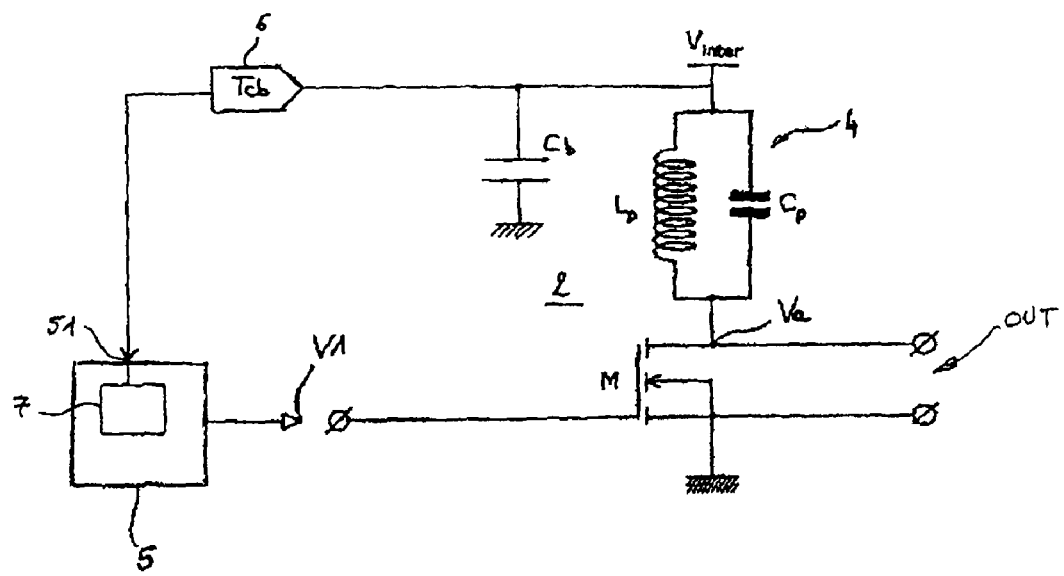
FIG. 2 is a diagram illustrating a power supply used for commanding the resonator of the coil-on-plug of FIG. 1.

The ignition device according to the invention comprises means 6 for measuring an electric parameter representative of a change in the supply voltage of the plasma-generation resonator during an ignition command, and a module 7 capable of determining a state of fouling of the ignition electrodes, as a function of the electric parameter measured and of a predetermined reference value.

The electric parameter in question is, for example, the voltage $T_{cb}$ at the terminals of the storage capacitor Cb of the supply circuit, measured at least two determined moments of the ignition command.

Therefore, at two determined moments of the ignition command, chosen for example at the beginning and at the end or just after the latter, a measurement is taken of the decline in voltage at the terminals of Cb, for example by using the voltmeter 6 measuring the voltage $T_{cb}$. The module 7, which may, for example, be incorporated into the control means 5, then reads this electric measurement via a reception interface 51 and then determines a state of fouling of the ignition electrodes as a function of this electric measurement of voltage change and of the predetermined reference value, as will be explained in greater detail below.

The choice of the measurement of the voltage at the terminals of the capacitor Cb at a determined moment in an ignition command in order to diagnose the state of fouling of the ignition electrodes arises from the following calculations:
  $T_{cb}(t)$ being the voltage at the terminals of the capacitor Cb as a function of time;
  $V_m(t)$ being the voltage at the terminals of the capacitor C as a function of time;

At the moment t=0, the command signal V1 is applied to the command grid of the switch M, thereby allowing the application of the high voltage to the terminals of the resonator of the coil-on-plug, at the frequency defined by the command signal V1.

At the moment t=D, following the application of the ignition command signal for the period D, the spark is generated between the ignition electrodes 10 and 12.

An energy balance of the coil-on-plug shows:

$$\frac{1}{2} \times Cb \times ([Tcb(t=0)]^2 - [Tcb(t=D)]^2) =$$
$$K \times \frac{1}{2} \times C \times ([Vm(t=D)]^2 - [Vm(t=0)]^2) \text{ where } Vm(t=0)=0$$
$$Vm(t=D) = \sqrt{\frac{Cb}{K \times C}([Tcb(t=0)]^2 - [Tcb(t=D)]^2}$$

Let:
$T_{cb\_n}(t)$ be the voltage at the terminals of the capacitor Cb as a function of time during an ignition command, when the coil-on-plug is new, that is to say before fouling of the ignition electrodes;

$T_{cb\_e}(t)$ be the voltage at the terminals of the capacitor Cb as a function of time during an ignition command, when the ignition electrodes of the coil-on-plug are fouled;

$V_{m\_n}(t)$ be the voltage at the terminals of the capacitor C of the resonator as a function of time during an ignition command, when the coil-on-plug is new, that is to say before fouling of the ignition electrodes, and $V_{m\_e}(t)$ be the voltage at the terminals of the capacitor C of the resonator as a function of time during an ignition command, when the ignition electrodes of the coil-on-plug are fouled, this gives according to the preceding equation:

$$Vm\_n(t=D) = \sqrt{\frac{Cb}{C}([Tcb\_n(t=0)]^2 - [Tcb\_n(t=D)]^2}$$
and
$$Vm\_e(t=D) = \sqrt{\frac{Cb}{C}([Tcb\_e(t=0)]^2 - [Tcb\_e(t=D)]^2}$$

Consequently, where $V_{m\_e}(t) < V_{m\_n}(t)$, it is possible to deduce therefrom the following equation of the diagnosis of the state of fouling of the ignition electrodes for $T_{cb\_n}(t=0)=T_{cb\_e}(t=0)$:

$$T_{cb\_e}(t=D) > T_{cb\_n}(t=D)$$

Figure 4:
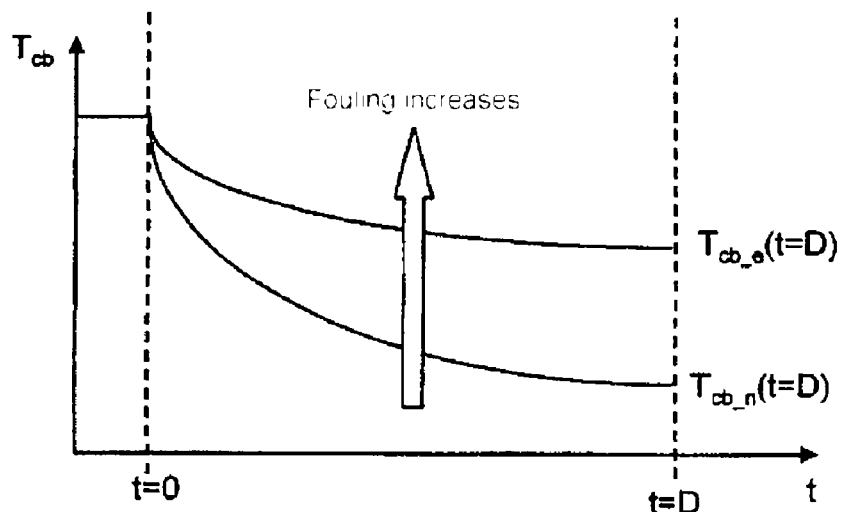
FIG. 4 is a diagram illustrating the effect of the fouling of the ignition electrodes on the change in voltage at the terminals of the capacitor Cb of the power supply during an ignition command.

In other words, as illustrated in FIG. 4, the decline in voltage at the terminals of the capacitor Cb during an ignition command (characterized by the difference between the value of the voltage at the terminals of Cb taken at the moment t=D and the value of this voltage taken at the moment t=0) decreases as the fouling of the ignition electrodes increases.

The energy balance specified above may be made for a command frequency substantially equal to the resonance frequency of the resonator. Specifically, the voltage decline at the terminals of the capacitor Cb during an ignition command being maximal when the resonator of the microwave coil-on-plug is controlled at its resonance frequency, the voltage measurement taken at the terminals of the capacitor Cb during an ignition command, used to diagnose the state of fouling of the ignition electrodes, is all the more significant.

Figure 3:
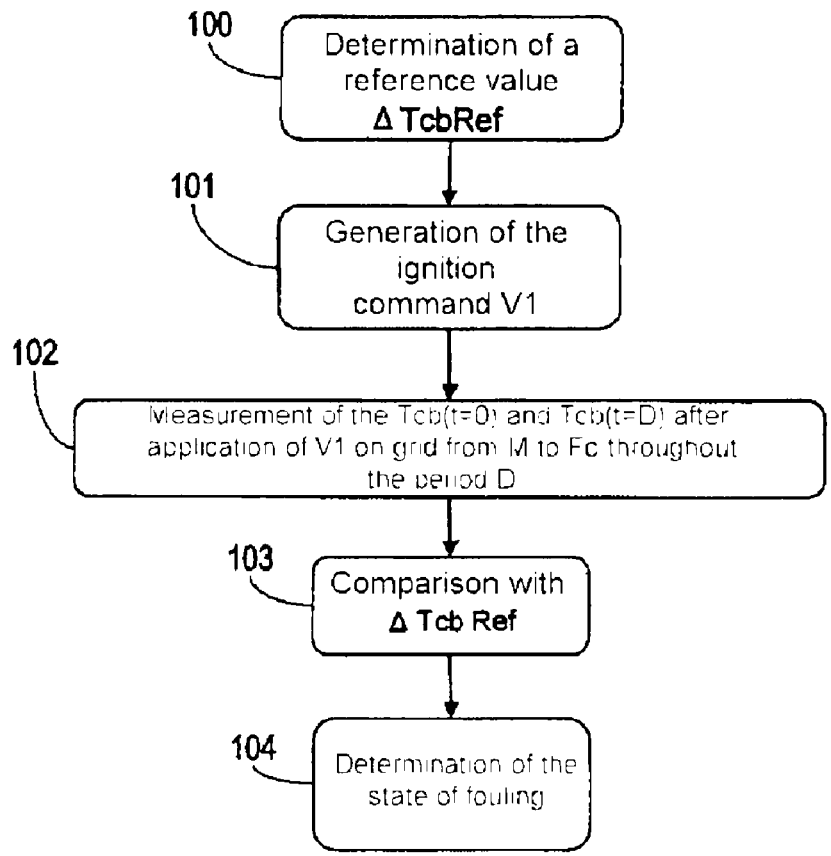
FIG. 3 is a flowchart illustrating an exemplary application of the method for diagnosing the state of fouling of the electrodes of a coil-on-plug.

FIG. 3 illustrates an example of an algorithm for diagnosing the state of fouling of the ignition electrodes, based on the measurement of the decline in voltage at the terminals of the capacitor Cb of the power supply during an ignition command.

A first step 100 consists in determining a reference value of voltage decline $\Delta T_{cb}\text{Ref}$ at the terminals of the capacitor Cb for a new sparkplug, i.e. before fouling of the ignition electrodes, between two determined moments of an ignition command, in given ignition conditions, being the value of the supply voltage that has to be applied, the duration D of application of the command signal V1 and its command frequency, chosen for example to be substantially equal to the resonance frequency of the resonator.

During a step 101, an identical voltage value is applied and a command signal V1 of an identical duration D is generated at the same command frequency, and is applied to the command gate of the transistor M in order to command the plasma-generation resonator.

During a step 102, the change in voltage at the terminals of the capacitor Cb is measured at the same determined moments of the ignition command as those chosen for determining the reference value. For example, these moments correspond to the moment t=0 and t=D of the application of the ignition command, in which the decline in the voltage at the terminals of the capacitor Cb is the most significant. The decline in voltage $T_{cb}(t=0)-T_{cb}(t=D)$ is measured, corresponding to the change in voltage at the terminals of Cb at the beginning and at the end of the ignition command, at the moment t=0 and t=D of application of the command signal V1.

All the same, the main thing is that the measured variation value and the reference value are representative of the same moments of an ignition command, moreover in identical conditions of application.

Then, during a step 103, this measured variation value $T_{cb}(t=0)-T_{cb}(t=D)$ is compared with the predetermined reference value $\Delta T cbRef$.

During a step 104, the state of fouling of the ignition electrodes is determined depending on whether the calculated difference between the value of the measured variation and the reference value exceeds a certain threshold.

In this instance, as a function notably of the type of coil-on-plug used and of the operating conditions of the engine, those skilled in the art will be able to identify various thresholds beyond which respectively the calculated difference is, for example, characteristic of a slightly fouled state, a fouled state or else a highly fouled state of the ignition electrodes.

As a variant, taking measurements of the voltage at the terminals of the capacitor Cb at each moment of an ignition command could be envisaged. These successive measurements of the decline in voltage at the terminals of Cb during an ignition command could then be used optimally by those skilled in the art to diagnose the state of fouling of the ignition electrodes.

In an application to plasma-generation motor vehicle ignition, it is proposed to use the diagnosis of the state of fouling of the sparkplugs thus obtained to notify the driver of a future failure on the ignition system. Also, a means of supplying information on the state of fouling of the sparkplugs is installed at least partially inside the passenger compartment of the motor vehicle. For example, a fault light-emitting diode lights up on the Man-Machine Interface of the vehicle to warn the driver of an ignition failure in future on the ignition system, depending on the state of fouling diagnosed.

It could also be envisaged to apply a degraded mode for the coils-on-plugs for which the diagnosis of the state of fouling of the electrodes indicates a future failure, in which the coil-on-plug is controlled at a specific voltage, by programming its amplitude, its frequency and its duration, so as to slow down the degradation of the component.

The invention claimed is:

1. A microwave ignition device comprising:
a controller that generates an ignition command signal;
a supply circuit, controlled by the ignition command signal, to apply a supply voltage to an output interface of the supply circuit at a frequency defined by the ignition command signal;
at least one plasma-generation resonator circuit connected to the output interface of the supply circuit and configured to generate a spark between two ignition electrodes of the resonator circuit during an ignition command;
a measuring unit that measures an electric parameter representative of a change in the supply voltage applied to the resonator circuit via the output interface; and
a determining unit that determines a state of fouling of the two ignition electrodes as a function of the electric parameter measured and of a predetermined reference value.

2. The device as claimed in claim 1, wherein the electric parameter is a voltage at terminals of a storage capacitor of the supply circuit, the storage capacitor suitable to be charged to the supply voltage before the ignition command.

3. The device as claimed in claim 1, wherein the supply circuit further comprises:
a switch controlled by the ignition command signal and configured to apply the supply voltage to the output interface at the frequency defined by the command signal.

4. The device as claimed in claim 1, wherein the command frequency is equal to the resonance frequency of the plasma-generation resonator circuit.

5. The device as claimed in claim 1, wherein the plasma-generation resonator circuit carries out an ignition in a controlled ignition of a combustion engine, ignition in a particle filter, or a decontamination ignition in an air-conditioning system.

6. The device as claimed in claim 1, further comprising:
a notification device that interfaces with a motor vehicle to supply information on the state of fouling of the electrodes.

7. A method implemented by a microwave ignition device, the method comprising:
generating an ignition command signal;
supplying, via a supply circuit controlled by the ignition command signal, a supply voltage to an output interface of the supply circuit at a frequency defined by the ignition command signal;

generating, via at least one plasma-generation resonator circuit connected to the output interface of the supply circuit, a spark between two ignition electrodes of the resonator circuit during an ignition command;

measuring, during the ignition command, a change in an electric parameter representative of a change in the supply voltage;

comparing the measured change with a predetermined reference value; and determining the state of fouling of the electrodes as a function of the difference between the measured change and the reference value.

8. The method as claimed in claim 7, wherein the change in a voltage at terminals of a storage capacitor of the supply circuit is measured as the electric parameter, the storage capacitor being charged to the supply voltage before the ignition command.

9. The method as claimed in claim 8, wherein the measured change in the voltage at the terminals of the storage capacitor arises from the difference between the measurement of the voltage at the terminals of the storage capacitor at the beginning and at the end of the ignition command.

10. The method as claimed in claim 7, wherein the predetermined reference value corresponds to the change in the supply voltage before fouling.

11. The method as claimed in claim 7, further comprising: informing a user of the state of fouling to notify the user of a future ignition failure.

12. A microwave ignition device comprising:

control means for generating an ignition command signal;

supply means, controlled by the ignition command signal, for supplying voltage to an output interface of the supply means at a frequency defined by the ignition command signal;

at least one plasma-generation means for generating a spark between two ignition electrodes of a resonator during an ignition command;

means for measuring an electric parameter representative of a change in the supply voltage applied to the resonator via the supply means; and means for determining a state of fouling of the two ignition electrodes as a function of the electric parameter measured and of a predetermined reference value.

* * * * *